(12) United States Patent
Tseng et al.

(10) Patent No.: US 11,817,397 B2
(45) Date of Patent: Nov. 14, 2023

(54) SEMICONDUCTOR DEVICE PACKAGE

(71) Applicant: Advanced Semiconductor Engineering, Inc., Kaohsiung (TW)

(72) Inventors: Chi Sheng Tseng, Kaohsiung (TW); Lu-Ming Lai, Kaohsiung (TW); Hui-Chung Liu, Kaohsiung (TW); Yu-Che Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 198 days.

(21) Appl. No.: 17/129,641

(22) Filed: Dec. 21, 2020

(65) Prior Publication Data
US 2022/0199550 A1 Jun. 23, 2022

(51) Int. Cl.
| | |
|---|---|
| *H01L 23/00* | (2006.01) |
| *H01L 23/538* | (2006.01) |
| *H01L 21/50* | (2006.01) |
| *G01L 1/26* | (2006.01) |
| *H01R 12/61* | (2011.01) |
| *H01L 21/60* | (2006.01) |

(52) U.S. Cl.
CPC .............. *H01L 23/562* (2013.01); *G01L 1/26* (2013.01); *H01L 21/50* (2013.01); *H01L 23/5387* (2013.01); *H01L 24/80* (2013.01); *H01R 12/61* (2013.01); *H01L 2021/60135* (2013.01)

(58) Field of Classification Search
CPC ... H01L 24/80; H01L 23/053; H01L 23/5387; H01L 23/562; H01L 24/13; H01L 24/16; H01L 2924/19105; H01L 2924/14; H01L 2924/00014; H01L 2021/60135; H01L 2924/19107; H01L 2224/13101; H01L 2924/014; H01L 21/50; H01R 12/61; G01L 1/26
USPC ........................................................... 257/48
See application file for complete search history.

(56) References Cited

U.S. PATENT DOCUMENTS

| | | | |
|---|---|---|---|
| 2019/0051613 A1* | 2/2019 | Ugge | H01L 23/49866 |
| 2021/0036044 A1* | 2/2021 | Kishi | H01L 27/14636 |
| 2022/0020664 A1* | 1/2022 | Lee | H01L 25/18 |

FOREIGN PATENT DOCUMENTS

| | | | | |
|---|---|---|---|---|
| CN | 110375799 B | * | 12/2021 | H04N 23/55 |
| WO | 2020026639 A1 | * | 2/2020 | H01L 23/34 |

* cited by examiner

*Primary Examiner* — Robert K Carpenter
(74) *Attorney, Agent, or Firm* — FOLEY & LARDNER LLP

(57) ABSTRACT

A semiconductor device package and a method for manufacturing a semiconductor device package are provided. The semiconductor device package includes a carrier, a sensor module, a connector, and a stress buffer structure. The sensor module is disposed on the carrier. The connector is connected to the carrier. The stress buffer structure connects the connector to the sensor module.

19 Claims, 12 Drawing Sheets

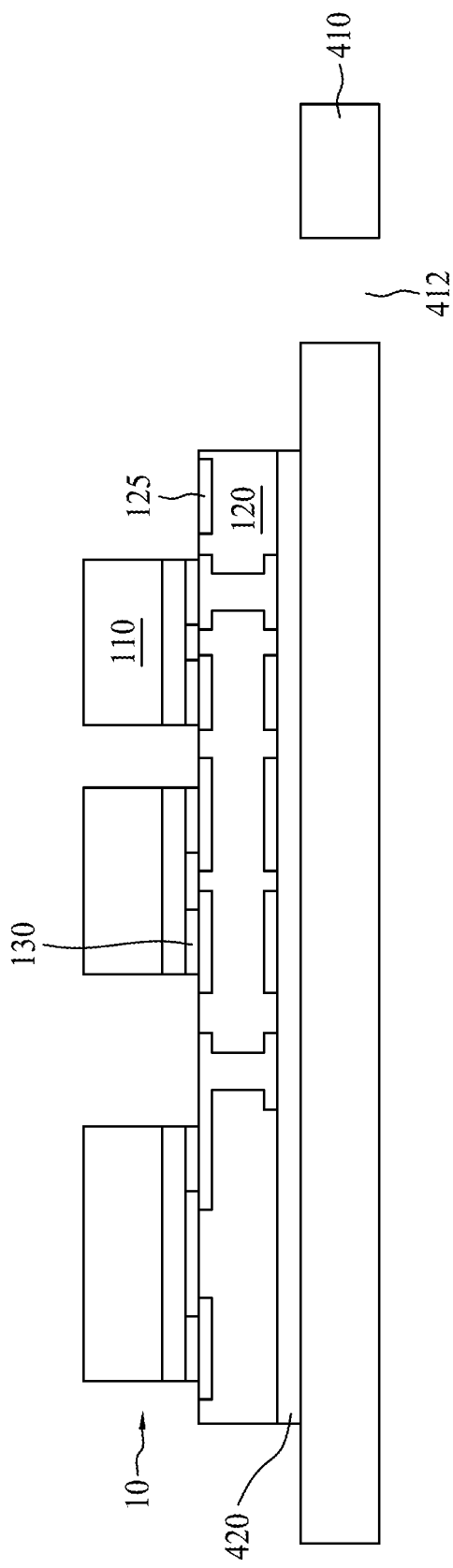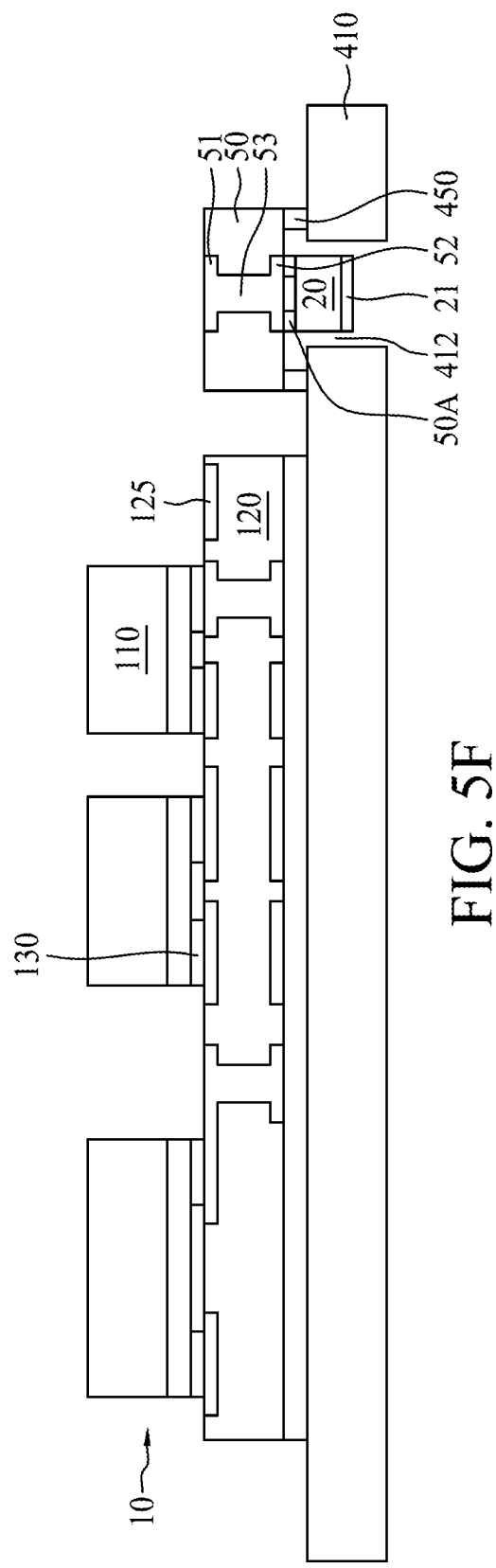

SEMICONDUCTOR DEVICE PACKAGE

BACKGROUND

1. Technical Field

The present disclosure relates generally to a semiconductor device package and a method for manufacturing a semiconductor device package, particularly to a semiconductor device package including a stress buffer structure and a method for manufacturing a semiconductor device package including a stress buffer structure.

2. Description of the Related Art

Inertial measurement units (IMUs) are widely used in various applications, for example, unmanned aerial vehicles and robot manipulators. IMUs may be disposed in small packages, and connectors are connected to the IMUs within the packages for external signal connection. However, the functions of the IMUs may be easily affected by impact upon connection of the connectors to external devices. For example, the stress applied on the connectors by external devices upon connection may adversely affect the sensing accuracy of the IMUs.

SUMMARY

In one or more embodiments, a semiconductor device package includes a carrier, a sensor module, a connector, and a stress buffer structure. The sensor module is disposed on the carrier. The connector is connected to the carrier. The stress buffer structure connects the connector to the sensor module.

In one or more embodiments, a method for manufacturing a semiconductor device package includes the following operations: providing a sensor module; providing a connector; and connecting the connector to the sensor module through a stress buffer structure by a solderless bonding process.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 5A, FIG. 5B, FIG. 5C1, FIG. 5C2, FIG. 5D, FIG. 5E, FIG. 5F and FIG. 5G illustrate various operations in a method of manufacturing a semiconductor device package in accordance with some embodiments of the present disclosure;

FIG. 6A, FIG. 6B1 and FIG. 6B2 illustrate various operations in a method of manufacturing a semiconductor device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
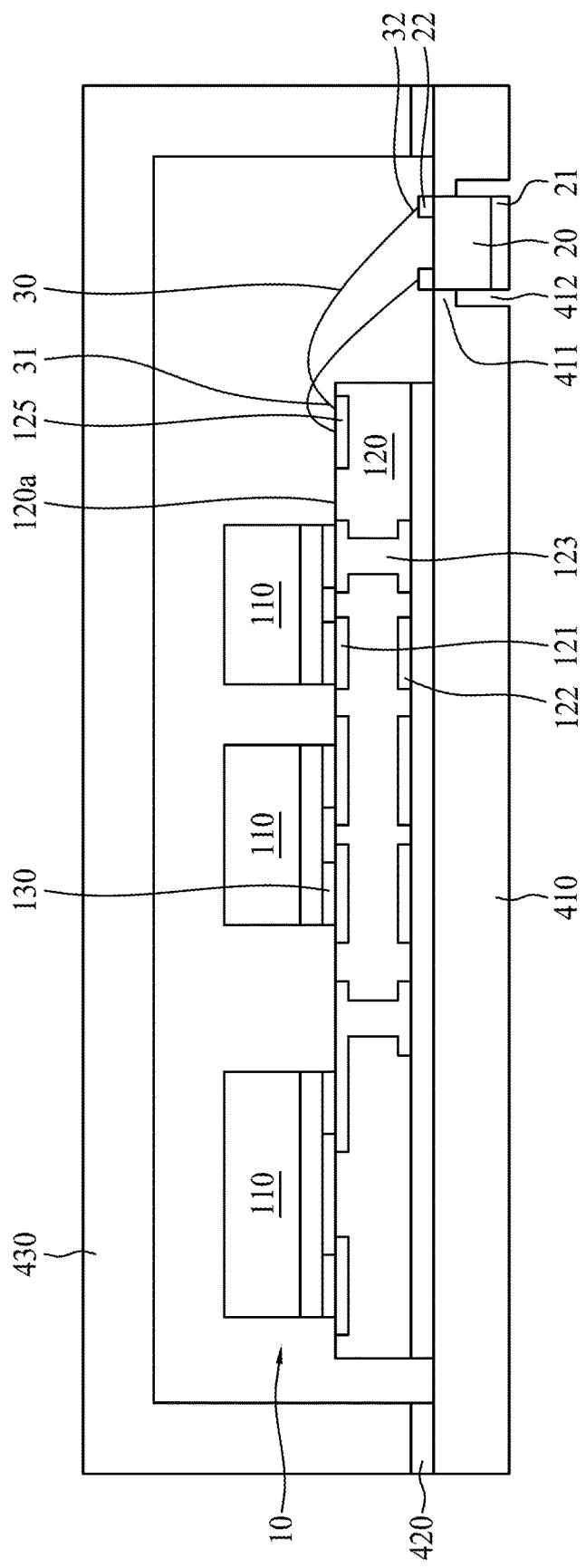
FIG. 1 illustrates a cross-sectional view of a semiconductor device package in accordance with some embodiments of the present disclosure.

FIG. 1 illustrates a cross-sectional view of a semiconductor device package 1 in accordance with some embodiments of the present disclosure. The semiconductor device package 1 includes a carrier 410, a buffer layer 420, a cover 430, a sensor module 10, a connector 20, and a stress buffer structure 30.

The carrier 410 may include, for example, a printed circuit board, such as a paper-based copper foil laminate, a composite copper foil laminate, or a polymer-impregnated glass-fiber-based copper foil laminate. The carrier 410 may include an interconnection structure, such as a plurality of conductive traces or a through via. In some embodiments, the carrier 410 includes a ceramic material or a metal plate. In some embodiments, the carrier 410 may include a substrate, such as an organic substrate or a leadframe.

The carrier 410 may be or include a rigid substrate. The cover 430 may be or include a rigid structure. The carrier 410 and the cover 430 may be or include an organic material (e.g., a plastic material), a ceramic material, or a metal material. The carrier 410 is connected to the cover 430. In some embodiments, the cover 430 and the carrier 410 define a space for accommodating the sensor module 10. For example, the carrier 410 and the cover 430 together may form a casing for disposing the sensor module 10 therein.

The buffer layer 420 is on the carrier 410. In some embodiments, the cover 430 is connected to the carrier 410 through the buffer layer 420. In some embodiments, the buffer layer 420 may be or include an adhesive layer, a gel layer, a flexible pad, or a combination thereof. In some embodiments, the buffer layer 420 includes an insulating material. The buffer layer 420 connecting the carrier 410 and the cover 430 may serve to buffer and/or release the stress between the carrier 410 and the cover 430. Accordingly, thermal warpage resulted from volume changes of the carrier 410 and the cover 430 and/or vibration generated from the carrier 410 and the cover 430 upon installation can be effectively reduced.

The sensor module 10 is disposed on the carrier 410. The sensor module 10 is disposed within the space defined by the carrier 410 and the cover 430. In some embodiments, the sensor module 10 is connected to the carrier 410. In some embodiments, the sensor module 10 is fastened to the carrier 410. For example, the sensor module 10 is fixed on the carrier 410. For example, the sensor module 10 may not have a movement relative to the carrier 410. In some embodiments, the sensor module 10 includes a stress-sensitive module. In some embodiments, the sensor module 10 is connected to the carrier 410 through the buffer layer 420.

Accordingly, thermal warpage resulted from volume changes of the carrier 410 and the sensor module 10 and/or vibration generated from the carrier 410 and the sensor module 10 upon installation can be effectively reduced.

In some embodiments, the sensor module 10 includes a substrate 120 and one or more electronic components 110. The substrate 120 may be, for example, a printed circuit board, such as a paper-based copper foil laminate, a composite copper foil laminate, or a polymer-impregnated glass-fiber-based copper foil laminate. In some embodiments, the substrate 120 may include an interconnection structure, such as a plurality of conductive traces 121 (or redistribution layers (RDLs)) and 122 and one or more through vias 123. In some embodiments, the substrate 120 may include one or more conductive pads 125 in proximity to, adjacent to, or embedded in and exposed at the surface 120a (also referred to as "an upper surface") of the substrate 120. The substrate 120 may include a solder resist (not shown in the drawing) on the surface 120a of the substrate 10 to fully expose or to expose at least a portion of the conductive pads 125 for electrical connections. In some embodiments, the conductive pad 125 may include a solderless pad. The conductive pad 125 may be or include a conductive material such as a metal or metal alloy. Examples include gold (Au), silver (Ag), aluminum (Al), copper (Cu), or an alloy thereof.

The electronic components 110 are disposed on the surface 120a of the substrate 120. The electronic components 110 are electrically connected to the substrate 120 (e.g., to the conductive trace 121) through solder bumps 130. In some embodiments, the electronic components 110 may be or include an active component, such as an integrated circuit (IC) chip or a die. In some embodiments, the electronic component 110 may include one or more sensing devices configured for motion detection, vibration detection, stress detection, or the like. In some embodiments, the electronic components 110 may include a microcontroller device. In some embodiments, the electronic components 110 may by or include a passive electrical component, such as a capacitor, a resistor or an inductor. In some embodiments, there may be any number of electronic components 110 disposed on the surface 120a of the substrate 120 depending on different specifications. In some embodiments, the electronic components 110 may be also disposed on a bottom surface of the substrate 120 or embedded within the substrate 120.

The connector 20 is connected to the carrier 410. In some embodiments, the connector 20 is fastened to the carrier 410. For example, the connector 20 is fixed on the carrier 410. For example, the connector 20 may not have a movement relative to the carrier 410. In some embodiments, the connector 20 is engaged with a protruded portion 411 of the carrier 410. In some embodiments, the protruded portion 411 may include a latch mechanism connecting or fastening the connector 20 to the body of the carrier 410. In some embodiments, the connector 20 is adhered to the carrier 410 through an adhesive material. In some embodiments, the protruded portion 411 of the carrier 410 may include an adhesive material connecting the connector 20 to the body of the carrier 410. In some embodiments, the connector 20 may provide electrical connections between the semiconductor device package 1 and external devices or external circuit boards.

In some embodiments, the carrier 410 defines a recess 412 adjacent to the protruded portion 411 for receiving a portion of the connector 20. In some embodiments, an external interface 21 of the connector 20 is received within the recess 412 of the carrier 410. In some embodiments, the connector 20 may include one or more conductive pads 22 in proximity to, adjacent to, or embedded in and exposed at a surface of the connector 20. In some embodiments, the conductive pad 22 may include a solderless pad. In some embodiments, the conductive pad 22 is within the space defined by the cover 430 and the carrier 410. The conductive pad 22 may be or include a conductive material such as a metal or metal alloy. Examples include Au, Ag, Al, Cu, or an alloy thereof.

The stress buffer structure 30 connects the connector 20 to the sensor module 10. In some embodiments, the stress buffer structure 30 and the sensor module 10 define a solder-free connection. For example, no soldering material is used for the connection between the stress buffer structure 30 and the sensor module 10. In some embodiments, the stress buffer structure 30 and the connector 20 define a solder-free connection. For example, no soldering material is used for the connection between the stress buffer structure 30 and the connector 20. In some embodiments, the term "solder-free connection" is used to describe a connection material or a connection element that is or includes a non-flowable material under a reflow operation. A temperature of the reflow process may be from about 250° C. to about 260° C. In some embodiments, the stress buffer structure 30 is bonded to the conductive pad 125 of the substrate 120. In some embodiments, the stress buffer structure 30 may be bonded to the conductive pad 125 of the substrate 120 by, for example, wire bonding or any other suitable techniques. In some embodiments, the stress buffer structure 30 is bonded to the conductive pad 22 of the connector 20. In some embodiments, the stress buffer structure 30 may be bonded to the conductive pad 22 of the connector 20 by, for example, wire bonding or any other suitable techniques.

In some embodiments, the stress buffer structure 30 includes an end 31 connecting to the sensor module 10 and an end 32 connecting to the connector 20. In some embodiments, the end 31 of the stress buffer structure 30 is or includes a solderless conductive portion. In some embodiments, the end 31 of the stress buffer structure 30 directly contacts the conductive pad 125 of the substrate 120 of the sensor module 10. In some embodiments, the end 32 of the stress buffer structure 30 is or includes a solderless conductive portion. In some embodiments, the end 32 of the stress buffer structure 30 directly contacts the conductive pad 22 of the connector 20. In some embodiments, the end 31 and the end 32 of the stress buffer structure 30 are at different elevations.

In some embodiments, the stress buffer structure 30 includes a non-flowable material under a reflow operation. In some embodiments, a temperature of the reflow process is from about 250° C. to about 260° C. In some embodiments, the non-flowable material includes a solder-free material. In some embodiments, the stress buffer structure 30 is made of or includes a solderless material. In some embodiments, the stress buffer structure 30 includes a flexible conductive element. In some embodiments, the stress buffer structure 30 includes a flexible solderless conductive element. In some embodiments, the stress buffer structure 30 includes a bonding wire. In some embodiments, the stress buffer structure 30 includes a plurality of bonding wires separated from each other. In some embodiments, a top portion of one of the bonding wires is at an elevation different from a top portion of another one of the bonding wires (not shown in FIG. 1). In some embodiments, a stress applied to the sensor module 10 is at least 50% less than a stress applied to the connector 20.

In some cases where a connector is fastened to or connected directly to a sensor module in a package (e.g., no buffer element is provided between the connector and the sensor module), stress from the connector upon connection with an external device may directly impact the sensor module in the package, and thus the sensing accuracy may be adversely affected by the stress. In contrast, according to some embodiments of the present disclosure, the stress buffer structure 30 can serve to buffer and/or release the stress or strain between the sensor module 10 and the connector 20, thus the impact caused by the stress from the connector 20 can be reduced, and hence the sensing accuracy of the sensor module 10 can be improved.

In addition, according to some embodiments of the present disclosure, the stress buffer structure 30 and the connector 20 define a solder-free connection, thus the components and/or structures (e.g., the carrier 410, the cover 430, and etc.) of the semiconductor device package 1 can be prevented from damage by one or more high-temperature solder bump bonding processes, and therefore the reliability of the semiconductor device package 1 can be improved. In addition, while the high-temperature solder bump bonding process can be omitted since the stress buffer structure 30 and the connector 20 define a solder-free connection, a heat-resistant or highly thermostable material is not required for manufacturing the carrier 410, and thus the manufacturing cost of materials can be reduced.

Figure 2:
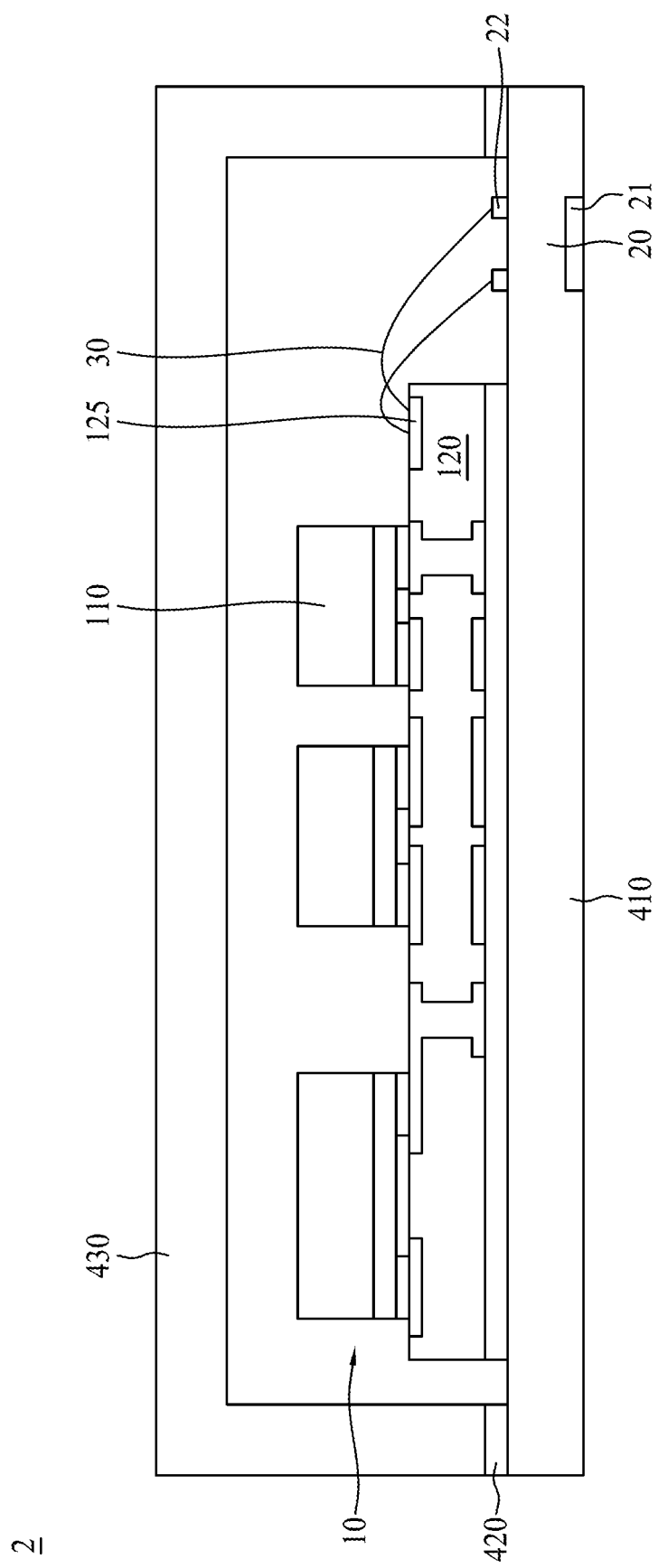
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1 except that, for example, the carrier 410 has a different structure.

In some embodiments, the connector 20 and the carrier 410 are formed integrally as a monolithic structure. In some embodiments, the exterior casing of the connector 20 and the carrier 410 are formed integrally as a monolithic structure. In some embodiments, the components of the connector 20 is formed within a portion of the carrier 410 so as to form the connector 20 that is formed integrally with the carrier 410 as a monolithic structure. In some embodiments, the external interface 21 of the connector 20 directly contacts the carrier 410.

According to some embodiments of the present disclosure, with the aforesaid design of the monolithic structure of the connector 20 and the carrier 410, the shift in positions of the connector 20 and the carrier 410 in the installation operation can be prevented, and the connector 20 can be stably connected or fastened to the carrier 410. Therefore, process errors in the manufacturing operation of the connector 20 and the carrier 410 can be prevented, and the reliability of the semiconductor device package 2 can be improved.

Figure 3A:
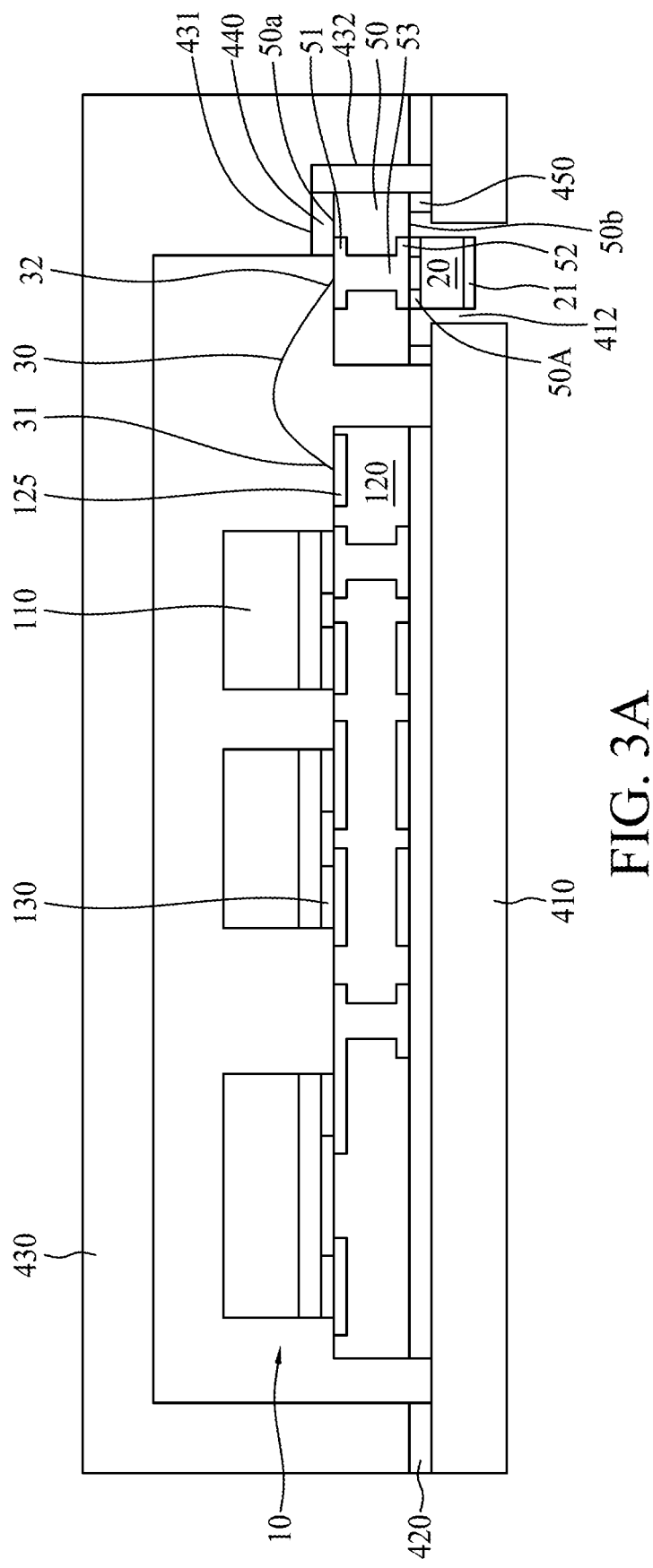
FIG. 3A illustrates a cross-sectional view of a semiconductor device package in accordance with some embodiments of the present disclosure.

FIG. 3A illustrates a cross-sectional view of a semiconductor device package 3 in accordance with some embodiments of the present disclosure. The semiconductor device package 3 is similar to the semiconductor device package 1 in FIG. 1 except that, for example, the semiconductor device package 3 further includes an interposer 50.

The interposer 50 is connected to the connector 20. In some embodiments, the interposer 50 may include an interconnection structure, such as a plurality of conductive traces (e.g., conductive pads 51 and 52) and one or more through vias 53. For example, the interposer 50 may include one or more conductive pads 51 proximity to, adjacent to, or embedded in and exposed at a surface 50a of the interposer 50. In some embodiments, the interposer 50 may be or include a rigid substrate. In some embodiments, the interposer 50 may be or include a printed circuit board (PCB). In some embodiments, the connector 20 is connected to the interposer 50 (e.g., to the conductive pad 52) through solder bumps 50A.

In some embodiments, the interposer 50 connects the stress buffer structure 30 to the connector 20. In some embodiments, the stress buffer structure 30 and the interposer 50 define a solder-free connection. For example, no soldering material is used for the connection between the stress buffer structure 30 and the interposer 50. In some embodiments, the stress buffer structure 30 connects the sensor module 10 to the conductive pad 51 of the interposer 50. In some embodiments, the stress buffer structure 30 may be bonded to the conductive pad 51 of the interposer 50 by, for example, wire bonding or any other suitable techniques. In some embodiments, the conductive pad 51 may include a solderless pad. The conductive pad 51 may be or include a conductive material such as a metal or metal alloy. Examples include Au, Ag, Al, Cu, or an alloy thereof. In some embodiments, the end 32 of the stress buffer structure 30 directly contacts the conductive pad 51 of the interposer 50. In some embodiments, the interposer 50 is connected to the carrier 410.

In some embodiments, the semiconductor device package 3 further includes a buffer layer 450 on the carrier 410. In some embodiments, the buffer layer 450 connects the interposer 50 to the carrier 410. In some embodiments, the buffer layer 450 directly contacts the carrier 410 and a surface 50b, which is opposite to the surface 50a, of the interposer 50.

In some embodiments, the cover 430 includes a step section having a step surface 431 facing the carrier 410, and the step surface 431 is angled with an internal surface 432 of the cover 430. In some embodiments, the semiconductor device package 3 further includes a buffer layer 440 on the step surface 431 of the cover 430. In some embodiments, the cover 430 is connected to the interposer 50 through the buffer layer 440. In some embodiments, the buffer layer 440 directly contacts the surface 50a of the interposer 50. In some embodiments, a portion of the interposer 50 is sandwiched between the carrier 410 and the step section of the cover 430 through the buffer layers 440 and 450. In some embodiments, the buffer layers 440 and 450 are made of or include one or more materials similar to that of the buffer layer 420, and the description thereof is omitted hereinafter. In some embodiments, the connector 20 is received within the recess 412 and spaced apart from the carrier 410.

According to some embodiments of the present disclosure, with the aforesaid design of the interposer 50, the elevation difference in two ends 31 and 32 of the stress buffer structure 30 can be reduced, thus the reliability of the formation operation of the stress buffer structure 30 can be improved. Therefore, the structure of the stress buffer structure 30 can be relatively stable, and the bonding strength of the stress buffer structure 30 can be improved as well.

Moreover, according to some embodiments of the present disclosure, with the aforesaid structural design of the cover 430, the interposer 50 can be sandwiched between and abutting the carrier 410 and the cover 430, and thus the interposer 50 can be connected or fastened to the carrier 410 and the cover 430 stably, providing a stable interconnection structure for the connector 20 to the carrier 410 and the cover 430. In addition, the buffer layers 440 and 450 can buffer and/or release the stress from the connector 20 to the interposer 50. Therefore, the impact caused by the stress from the connector 20 towards the interposer 50 can be reduced, and hence the sensing accuracy of the sensor module 10 can be improved.

Figure 3B:
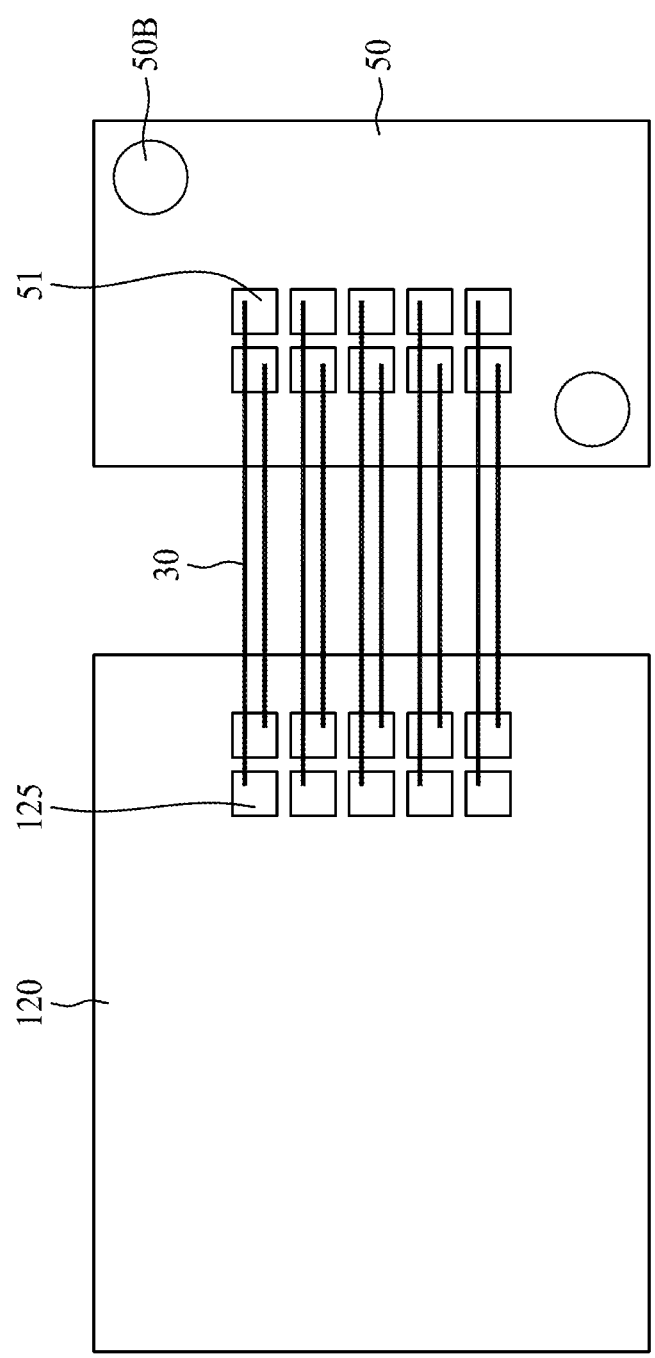
FIG. 3B illustrates an enlarged top view of a portion of a semiconductor device package in accordance with some embodiments of the present disclosure.

FIG. 3B illustrates an enlarged top view of a portion of a semiconductor device package 3 in accordance with some embodiments of the present disclosure. In some embodiments, FIG. 3B illustrates a top view of portions of the substrate 120 of the sensor module 10, the stress buffer structure 30, and the interposer 50.

In some embodiments, the stress buffer structure 30 may include a plurality of bonding wires. In some embodiments, each of the bonding wires connects one solderless pad (e.g., the conductive pad 51) of the interposer 50 to one of the solderless pads (e.g., the conductive pads 125) of the substrate 120.

In some embodiments, the interposer 50 may further include a connecting element 50B connected to the carrier 410. The connecting element 50B may be or include a fastening element. In some embodiments, the connecting element 50B includes a screw hole and a plug, and the plug passes through the screw hole to connect the interposer 50 to the carrier 410.

Figure 4:
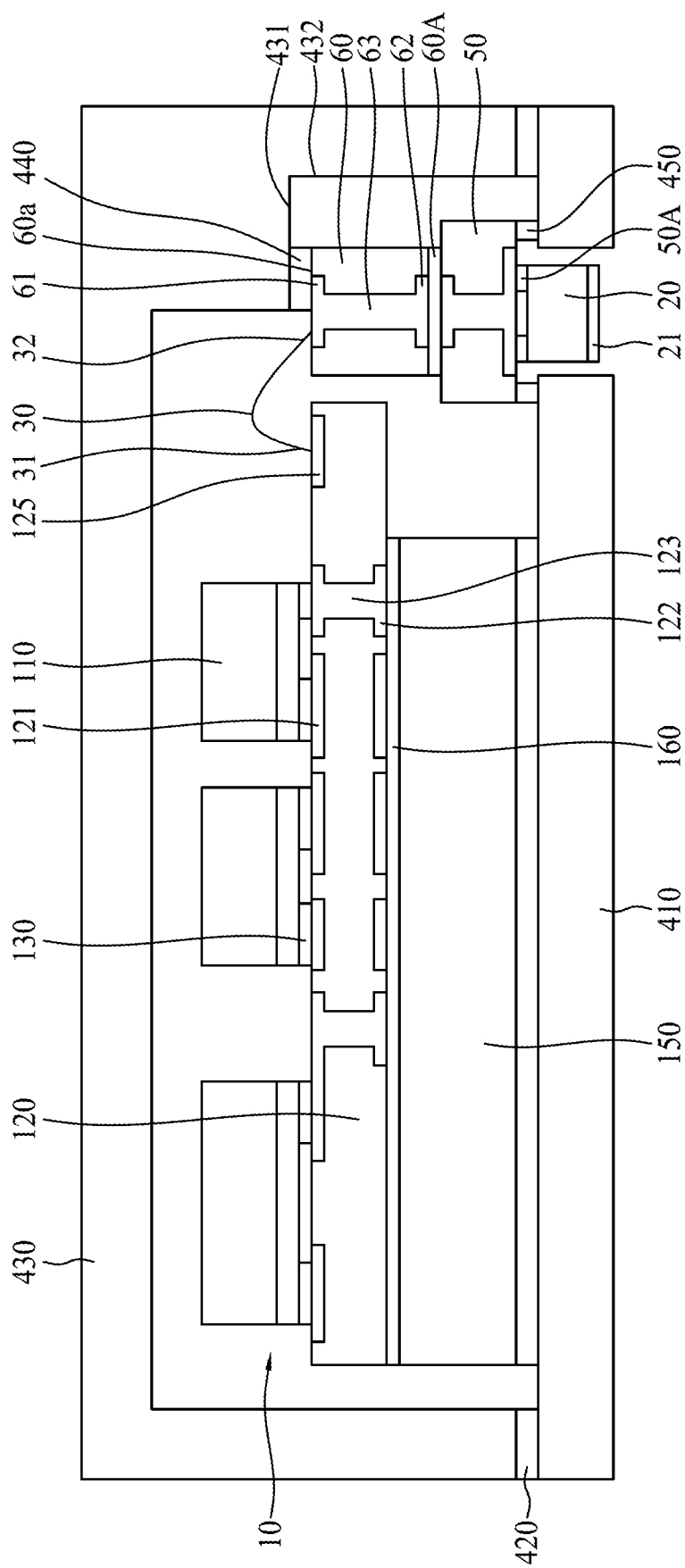
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 is similar to the semiconductor device package 3 in FIG. 3A except that, for example, the semiconductor device package 4 further includes an interposer 60.

The interposer 60 is connected to the interposer 50. In some embodiments, the interposer 60 may include an interconnection structure, such as a plurality of conductive traces (e.g., conductive pads 61 and 62) and one or more through vias 63. For example, the interposer 60 may include one or more conductive pads 61 proximity to, adjacent to, or embedded in and exposed at a surface 60a of the interposer 60. In some embodiments, the interposer 60 may be or include a rigid substrate. In some embodiments, the interposer 60 may be or include a printed circuit board (PCB). In some embodiments, the interposer 50 is connected to the interposer 60 through a solder bump 60A.

In some embodiments, the interposer 60 connects the stress buffer structure 30 to the interposer 50. In some embodiments, the stress buffer structure 30 and the interposer 60 define a solder-free connection. For example, no soldering material is used for the connection between the stress buffer structure 30 and the interposer 60. In some embodiments, the stress buffer structure 30 connects the sensor module 10 to the conductive pad 61 of the interposer 60. In some embodiments, the stress buffer structure 30 may be bonded to the conductive pad 61 of the interposer 60 by, for example, wire bonding or any other suitable techniques. In some embodiments, the conductive pad 61 may include a solderless pad. The conductive pad 61 may be or include a conductive material such as a metal or metal alloy. Examples include Au, Ag, Al, Cu, or an alloy thereof. In some embodiments, the end 32 of the stress buffer structure 30 directly contacts the conductive pad 61 of the interposer 60.

In some embodiments, the cover 430 is connected to the interposer 60 through the buffer layer 440. In some embodiments, the buffer layer 440 directly contacts the surface 60a of the interposer 60. In some embodiments, a portion of the interposer 50 and a portion of the interposer 60 are sandwiched between the carrier 410 and the step section of the cover 430 through the buffer layers 440 and 450.

In some embodiments, the sensor module 10 further includes a substrate 150 disposed between the carrier 410 and the substrate 120. In some embodiments, the substrate 150 may include an organic substrate, a ceramic substrate, or a metal substrate. In some embodiments, the substrate 150 may include a semiconductor substrate, one or more integrated circuit devices, and one or more overlying interconnection structures therein. The integrated circuit devices may include active devices such as transistors and/or passive devices such resistors, capacitors, inductors, or a combination thereof. In some embodiments, the substrate 150 is connected to the carrier 410 through the buffer layer 420. In some embodiments, the substrate 120 is connected to the substrate 150 through a buffer layer 160. In some embodiments, the buffer layer 160 is made of or includes one or more materials similar to that of the buffer layer 420, and the description thereof is omitted hereinafter.

According to some embodiments of the present disclosure, while the substrate 120 of the sensor module 10 is elevated, for example by the substrate 150, according to some design needs, with the aforesaid design of the interposers 50 and 60, the elevation difference in two ends 31 and 32 of the stress buffer structure 30 can be reduced, thus the reliability of the formation operation of the stress buffer structure 30 can be improved. Therefore, the structure of the stress buffer structure 30 can be relatively stable, and the bonding strength of the stress buffer structure 30 can be improved as well.

FIG. 5A, FIG. 5B, FIG. 5C1, FIG. 5C2, FIG. 5D, FIG. 5E, FIG. 5F and FIG. 5G illustrate various operations in a method of manufacturing a semiconductor device package 3 in accordance with some embodiments of the present disclosure.

Figure 5A:
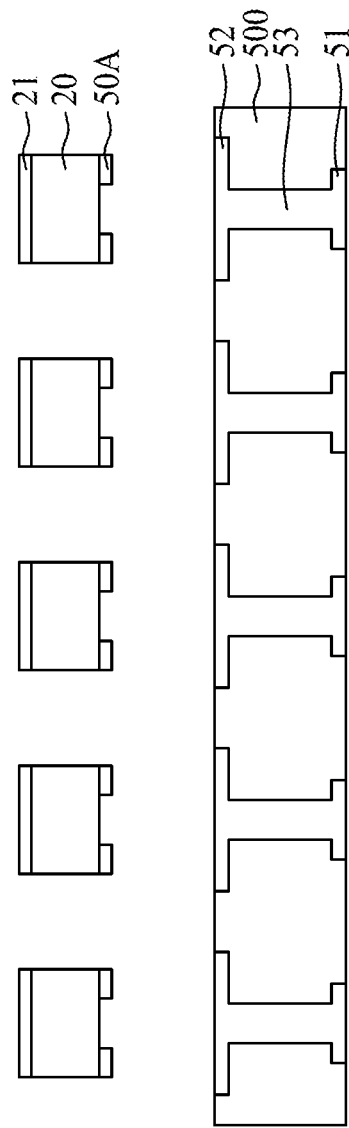

Referring to FIG. 5A, one or more connectors 20 are provided, and an interposer structure 500 is provided. In some embodiments, solder bumps 50A are formed on the connectors 20. In some embodiments, the interposer structure 500 includes a plurality of conductive traces (e.g., pads 51 and 52) and a plurality of through vias 53.

Figure 5B:
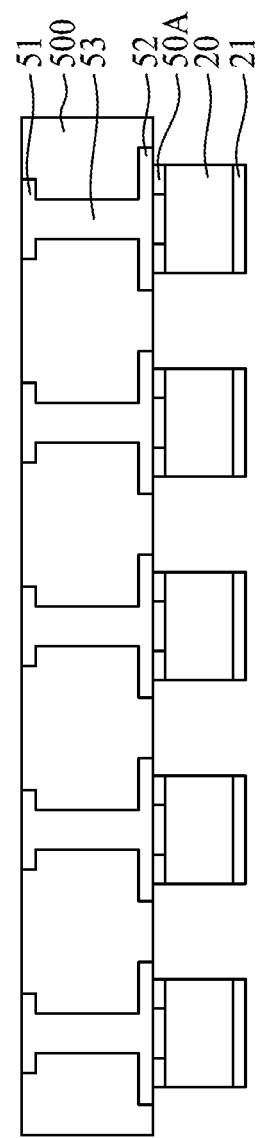

Referring to FIG. 5B, the connectors 20 are connected to the interposer structure 500. In some embodiments, the connectors 20 are bonded to the interposer structure 500 through the solder bumps 50A by a solder bump bonding process.

Referring to FIG. 5C1, a singulation operation is performed on the interposer structure 500 to form a plurality of singulated structures, and each of the singulated structures includes an interposer 50 connected to a connector 20. Referring to FIG. 5C2, which illustrates a top view of a singulated structure shown in FIG. 5C1 in accordance with some embodiments of the present disclosure. In some embodiments, the interposer 50 may include a plurality of pads 51.

Figure 5D:
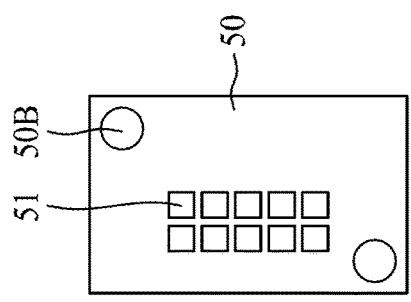
Figure 5D:
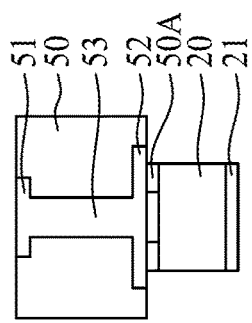
Figure 5D:
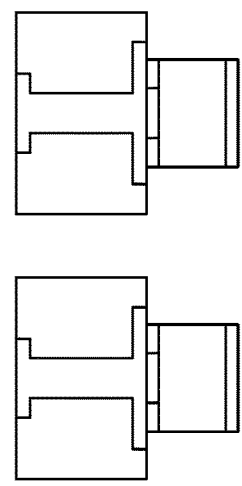
Figure 5D:
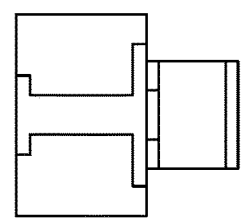
Figure 5D:
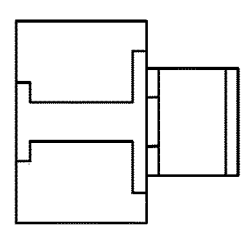
Figure 5D:
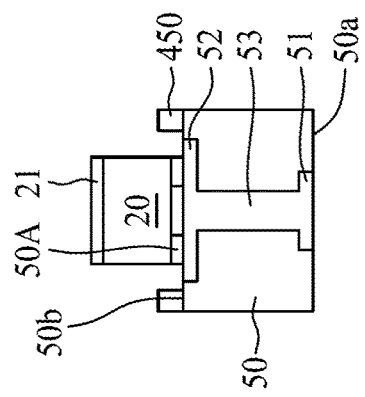

Referring to FIG. 5D, a buffer layer 450 is disposed on a surface 50b of the interposer 50. In some embodiments, the buffer layer 450 may include a gel layer, and disposing the buffer layer 450 may include dispensing a gel layer on the surface 50b of the interposer 50. In some embodiments, the buffer layer 450 may include an adhesive layer or a flexible pad, and disposing the buffer layer 450 may include disposing an adhesive layer or a flexible pad on the surface 50b of the interposer 50.

Referring to FIG. 5E, a sensor module 10 is provided, and then the sensor module 10 is connected to a carrier 410. In some embodiments, the sensor module 10 is fastened to the carrier 410. In some embodiments, a buffer layer 420 is disposed on the carrier 410, and the sensor module 10 is connected to the carrier 410 through the buffer layer 420. In some embodiments, a conductive material (i.e., the conductive pad 125) may be formed on the sensor module 10. In some embodiments, the conductive material may be or include a solderless material.

Referring to FIG. 5F, the connector 20 is connected to the carrier 410. In some embodiments, the connector 20 is fastened to the carrier 410. In some embodiments, the connector 20 is connected or fastened to the carrier 410 through the interposer 50. In some embodiments, the interposer 50 is connected to the carrier 410 through the buffer layer 450.

Figure 5G:
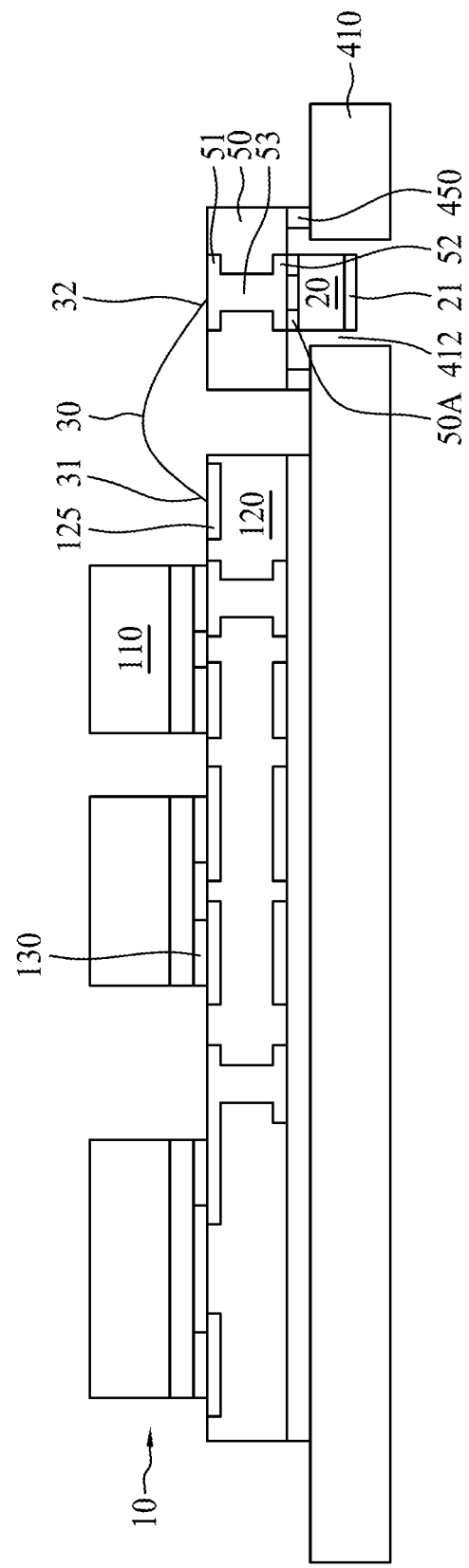

Referring to FIG. 5G, the connector 20 is connected to the sensor module 10 through a stress buffer structure 30 by a solderless bonding process. In some embodiments, the solderless bonding process is performed under a temperature lower than about 150° C. In some embodiments, the solderless bonding process is performed under a temperature about 100° C. In some embodiments, the connector 20 is connected to the sensor module 10 through the interposer 50 and the stress buffer structure 30 by the solderless bonding process. In some embodiments, the interposer 50 is connected to the sensor module 10 through the stress buffer structure 30 by the solderless bonding process. In some embodiments, the solderless bonding process includes a wire bonding process.

In some cases when the connector 20 or the interposer 50 with the connector 20 attached thereto is connected to the sensor module 10 through a solder bump bonding process, solder bumps are disposed on the connector 20 or the interposer 50 prior to bonding. The subsequent high-temperature reflow process (e.g., under a temperature about 250° C. to about 260° C.) may melt the solder bumps, and the melted solder material may render position shifts in the solder bumps, resulting in misalignment or solder bridge issues. The process yield may be relatively low, and the reliability of the as-formed semiconductor device package may be relatively low as well. In contrast, according to some embodiments of the present disclosure, the aforesaid solderless bonding process can prevent position shifts in connection between the connector 20 and the carrier 410 caused by melted solder materials, and the carrier 410 can be prevented from damage by the high-temperature reflow process, In addition, a heat-resistant or highly thermostable material is not required for manufacturing the carrier 410, which reduces the cost of materials of the semiconductor device package. Moreover, the aforesaid solderless bonding process (e.g., wire bonding process) is compatible with the processing operations for forming packaging structures (e.g., formation operations of dielectric layers, conductive layers, encapsulation layers, and etc.), introduction of different mechanical assembling and setting processes can be omitted, thus the manufacturing yield can be improved, and the manufacturing cost can be reduced.

In some embodiments, the solderless bonding process may include the following operations: connecting an end 31 of the stress buffer structure 30 to the solderless material (e.g., the conductive pad 125) of the substrate 120, connecting an end 32 of the stress buffer structure 30 to a solderless material (e.g., the conductive pad 51) of the interposer 50, and heating the solderless materials so as to form a solderless connecting element (i.e., the conductive pad 125) bonded to the end 31 of the stress buffer structure 30 and a solderless connecting element (i.e., the conductive pad 51) bonded to the end 32 of the stress buffer structure 30.

In some embodiments, the solderless material may include a conductive paste including an adhesive layer and conductive particles dispersed in the adhesive layer. In some embodiments, the solderless materials are heated by a UV curing process, a laser assisted bonding (LAB) process, or a combination thereof. In some embodiments, heating the solderless material may be performed prior to or after connecting the connector 20 to the carrier 410.

In some embodiments, connecting the sensor module 10 and the connector 20 to the carrier 410 may be prior to connecting the connector 20 to the sensor module 10 through the stress buffer structure 30.

Next, referring to FIG. 3A, a cover 430 is connected to the carrier 410 through the buffer layer 420, and the cover 430 is connected to the interposer 50 through the buffer layer 440. As such, the semiconductor device package 3 illustrated in FIG. 3A is formed.

FIG. 6A, FIG. 6B1 and FIG. 6B2 illustrate various operations in a method of manufacturing a semiconductor device package 4 in accordance with some embodiments of the present disclosure.

Figure 6A:
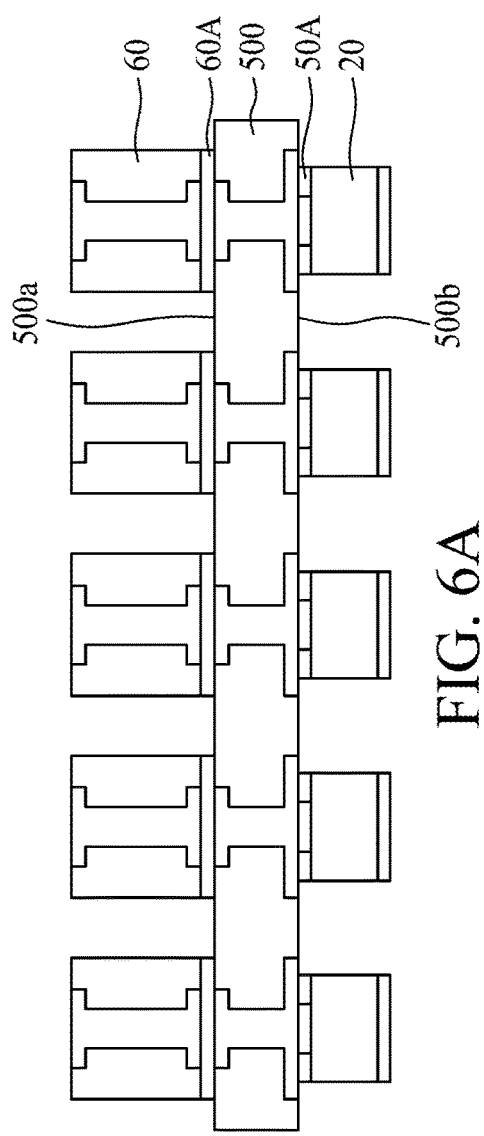
Figure 6A:
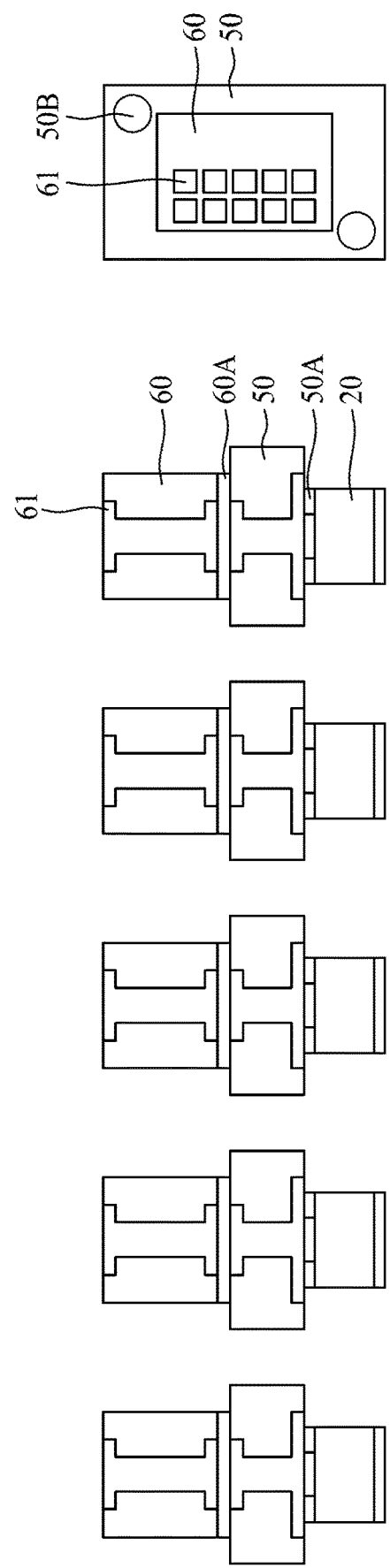
Figure 6A:
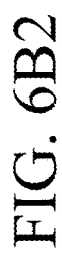

Referring to FIG. 6A, an interposer structure 500 having a surface 500*a* and a surface 500*b* opposite to the surface 500*a* is provided, connectors 20 are connected to the surface 500*b* of an interposer structure 500, and a plurality of interposers 60 are connected to the surface 500*b* of an interposer structure 500. In some embodiments, the interposers 60 are bonded to the interposer structure 500 through solder bumps 60A by a solder bump bonding process.

Referring to FIG. 6B1, a singulation operation is performed on the interposer structure 500 to form a plurality of singulated structures, and each of the singulated structures includes an interposer 50 connected to a connector 20 and an interposer 60. Referring to FIG. 6B2, which illustrates a top view of a singulated structure shown in FIG. 6B1 in accordance with some embodiments of the present disclosure. In some embodiments, the interposer 60 may include a plurality of pads 61.

Next, operations similar to those illustrated in FIGS. 5D-5G are performed. As such, the semiconductor device package 4 illustrated in FIG. 4 is formed.

Figure 7A:
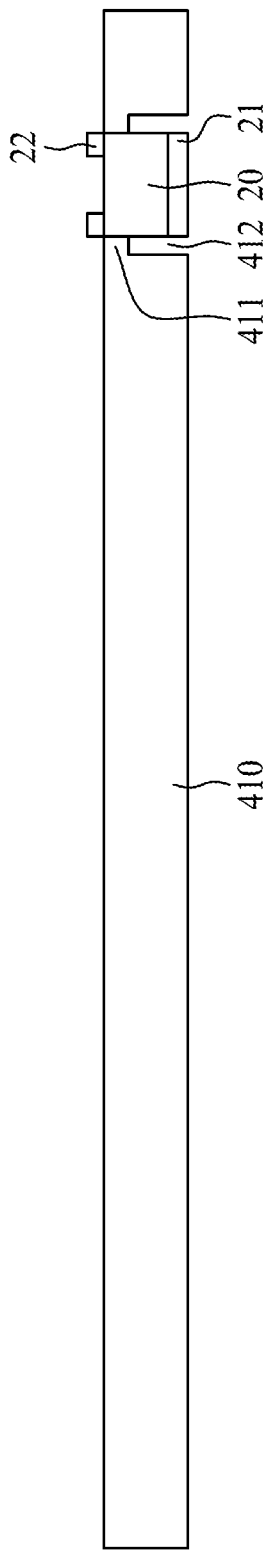
FIG. 7A, FIG. 7B and FIG. 7C illustrate various operations in a method of manufacturing a semiconductor device package in accordance with some embodiments of the present disclosure.
Figure 7B:
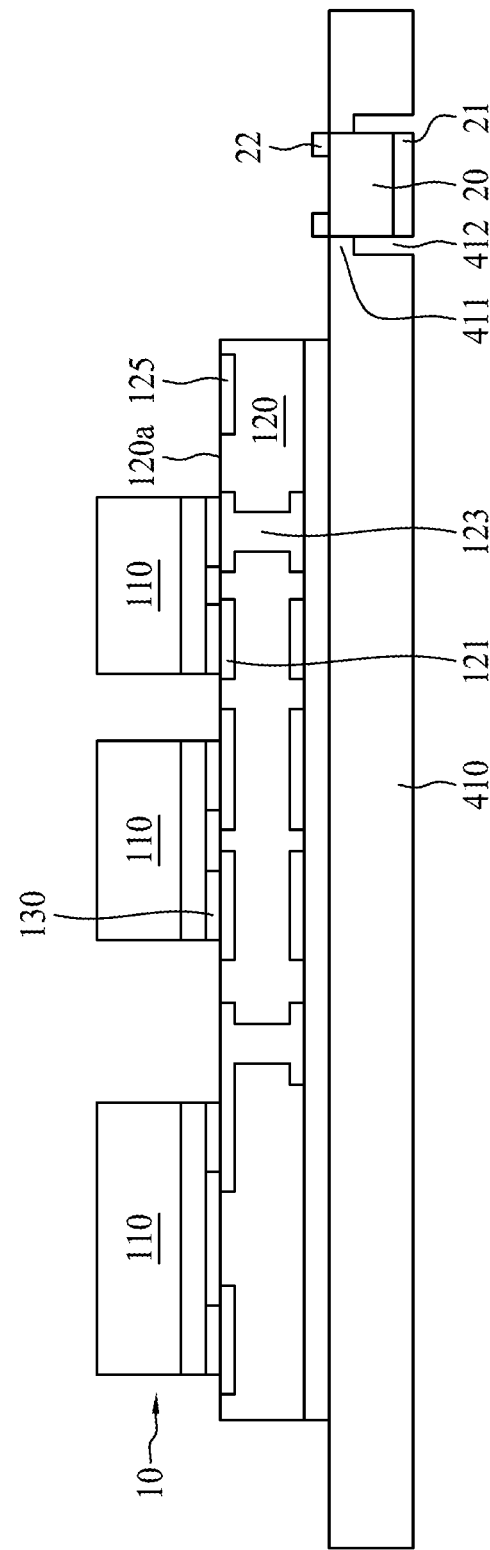
Figure 7C:
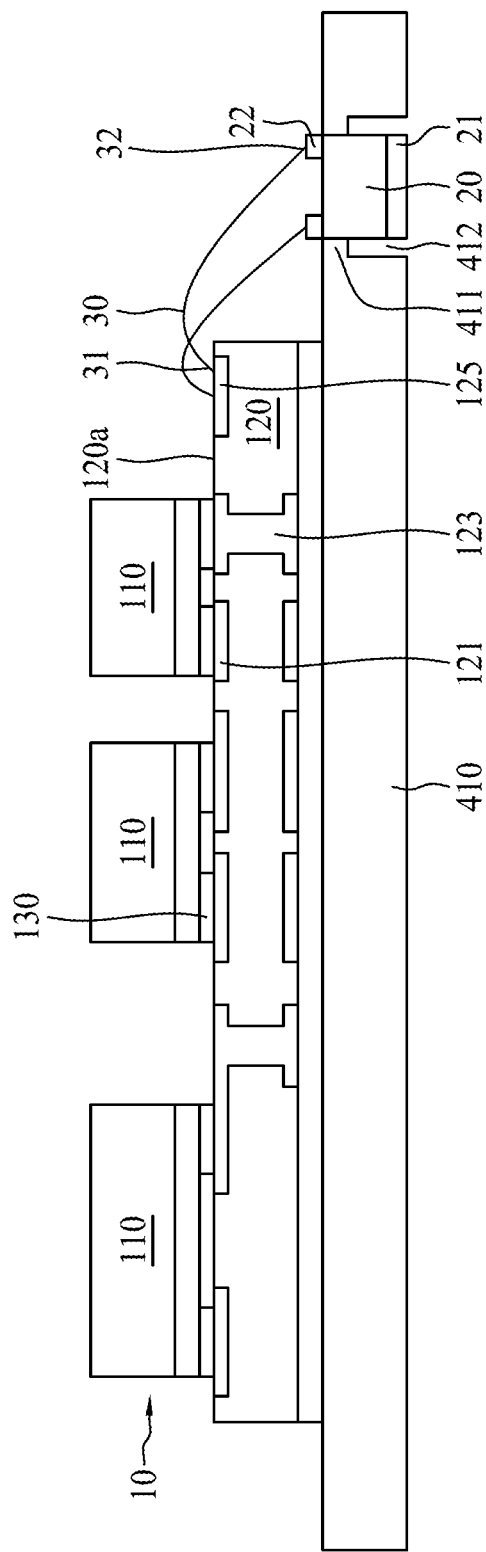

FIG. 7A, FIG. 7B and FIG. 7C illustrate various operations in a method of manufacturing a semiconductor device package 1 in accordance with some embodiments of the present disclosure.

Referring to FIG. 7A, a carrier 410 is provided, a connector 20 is connected to the carrier 410, and a conductive material (i.e., the conductive pad 22) is formed on the connector 22. In some embodiments, the connector 20 is fastened to the carrier 410. In some embodiments, the conductive material may be or include a solderless material. In some embodiments, the connector 20 is engaged with a protruded portion 411 of the carrier 410.

Referring to FIG. 7B, a buffer layer 420 is disposed on the carrier 410, a sensor module 10 is connected to the carrier 410 through the buffer layer 420, and a solderless material (e.g., the conductive pad 125) is formed on the sensor module 10.

Referring to FIG. 7C, the connector 20 is connected to the sensor module 10 through a stress buffer structure 30 by a solderless bonding process. In some embodiments, the connector 20 may be connected to the sensor module 10 through the stress buffer structure 30 by forming an end 31 (also referred to as "a first bond") connected to the sensor module 10; forming an extension portion of the stress buffer structure 30 connected to the end 31; and forming an end 32 (also referred to as "a second bond") connected to the extension portion and connected to the connector 20. In some embodiments, the solderless bonding process may include the following operations: connecting the end 31 of the stress buffer structure 30 to the solderless material (e.g., the conductive pad 125) of the substrate 120, connecting the end 32 of the stress buffer structure 30 to the solderless material (e.g., the conductive pad 22) of the connector 20, and heating the solderless materials so as to form a solderless connecting element (i.e., the conductive pad 125) bonded to the end 31 of the stress buffer structure 30 and a solderless connecting element (i.e., the conductive pad 22) bonded to the end 32 of the stress buffer structure 30.

Next, referring to FIG. 1, a cover 430 is connected to the carrier 410 through the buffer layer 420. As such, the semiconductor device package 1 illustrated in FIG. 1 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a carrier;
   a sensor module disposed on the carrier, wherein the sensor module comprises a substrate and a sensing device on the substrate;
   a connector connected to the carrier; and
   a stress buffer structure connecting the connector to the sensor module, wherein the stress buffer structure is bonded to a solderless pad of the substrate.

2. The semiconductor device package of claim 1, wherein the stress buffer structure has a non-flowable material under a reflow process.

3. The semiconductor device package of claim 2, wherein a temperature of the reflow process is from about 250° C. to about 260° C.

4. The semiconductor device package of claim 2, wherein the non-flowable material comprises a solder-free material.

5. The semiconductor device package of claim 1, wherein the stress buffer structure comprises a first bonding wire.

6. The semiconductor device package of claim 5, wherein the stress buffer structure further comprises a second bonding wire separated from the first bonding wire.

7. The semiconductor device package of claim 1, wherein the sensor module comprises a stress-sensitive module.

8. The semiconductor device package of claim 1, wherein the stress buffer structure comprises a flexible conductive element.

9. The semiconductor device package of claim 1, further comprising:
   a buffer layer on the carrier.

10. The semiconductor device package of claim 9, further comprising:
    a cover connected to the carrier through the buffer layer, the cover and the carrier defining a space for accommodating the sensor module.

11. The semiconductor device package of claim 1, wherein the connector and the carrier are formed integrally as a monolithic structure, and the sensor module is connected to the carrier.

12. The semiconductor device package of claim 1, further comprising a first interposer connecting the stress buffer structure to the connector.

13. The semiconductor device package of claim 12, wherein the sensor module and the first interposer are connected to the carrier.

14. The semiconductor device package of claim 12, wherein the connector is spaced apart from the carrier.

15. The semiconductor device package of claim 12, further comprising a buffer layer connecting the sensor module and the first interposer to the carrier.

16. The semiconductor device package of claim 12, further comprising:
a second interposer connected to the first interposer, wherein the stress buffer structure connects to the first interposer, and the first interposer is configured to reduce an elevation difference in two ends of the stress buffer structure.

17. The semiconductor device package of claim 1, wherein the stress buffer structure comprises a first end connecting to the connector and a second end connecting to the sensor module, the first end and the second end at different elevations.

18. A semiconductor device package, comprising:
a carrier;
a sensor module disposed on the carrier;
a connector connected to the carrier;
a stress buffer structure connecting the connector to the sensor module; and
a first interposer connected to the connector, wherein the stress buffer structure connects the sensor module to a solderless pad of the first interposer.

19. A semiconductor device package, comprising:
a carrier;
a sensor module disposed on the carrier;
a connector connected to the carrier;
a stress buffer structure connecting the connector to the sensor module;
a first interposer connecting the stress buffer structure to the connector;
a cover connected to the carrier, the cover and the carrier defining a space for accommodating the sensor module; and
a buffer layer disposed between the cover and the first interposer and configured to buffer a stress from the connector to the first interposer, wherein the cover is connected to the carrier through the buffer layer.

* * * * *